(12) United States Patent  
Nam et al.

(10) Patent No.: US 8,733,547 B2
(45) Date of Patent: May 27, 2014

(54) CASSETTE FOR ACCOMODATING SUBSTRATES

(75) Inventors: Eui-Woong Nam, Yongin (KR); Koang-Pyo Jin, Yongin (KR); Sang-Kyu Cho, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 89 days.

(21) Appl. No.: 13/303,575

(22) Filed: Nov. 23, 2011

(65) Prior Publication Data

US 2013/0008819 A1 Jan. 10, 2013

(30) Foreign Application Priority Data

Jul. 7, 2011 (KR) .................. 10-2011-0067539

(51) Int. Cl.
*B65D 85/48* (2006.01)
(52) U.S. Cl.
USPC ........................................... 206/454
(58) Field of Classification Search
CPC ............ H01L 23/02; B65D 85/48; H05K 5/00
USPC .................. 206/454, 710, 711, 722, 724, 818
See application file for complete search history.

(56) References Cited

U.S. PATENT DOCUMENTS

| | | | | |
|---|---|---|---|---|
| 5,915,562 A | * | 6/1999 | Nyseth et al. | 206/710 |
| 6,336,567 B1 | * | 1/2002 | Hyobu | 220/230 |
| 6,491,177 B1 | * | 12/2002 | Hyobu | 206/711 |
| 7,909,167 B2 | * | 3/2011 | Chiu et al. | 206/710 |
| 2007/0175792 A1 | * | 8/2007 | Gregerson | 206/711 |
| 2007/0297884 A1 | * | 12/2007 | Jung | 414/411 |
| 2009/0272743 A1 | * | 11/2009 | Meulen | 220/230 |

FOREIGN PATENT DOCUMENTS

| | | |
|---|---|---|
| JP | 09-115997 | 5/1997 |
| JP | 2002-222852 | 8/2002 |
| JP | 2003-089315 | 3/2003 |
| KR | 10-2001-0098420 A | 11/2001 |
| KR | 10-2004-0066963 A | 7/2004 |
| KR | 10-2005-0003763 A | 1/2005 |
| KR | 10-2007-0021733 A | 2/2007 |

* cited by examiner

*Primary Examiner* — Andrew Perreault
(74) *Attorney, Agent, or Firm* — Lee & Morse, P.C.

(57) ABSTRACT

A cassette for accommodating substrates, the cassette including; a cassette main body for accommodating a plurality of substrates, the cassette main body having an open side; a door detachably coupled to the open side for optionally sealing the cassette main body; a pin unit disposed on the door and configured to be coupled to the cassette main body; and a magnetic portion on the door for coupling the door with the cassette main body according to movement of the pin unit.

26 Claims, 6 Drawing Sheets

CASSETTE FOR ACCOMODATING SUBSTRATES

CROSS-REFERENCE TO RELATED PATENT APPLICATIONS

This application claims the benefit of Korean Patent Application No. 10-2011-0067539, filed on Jul. 7, 2011, in the Korean Intellectual Property Office, the disclosure of which is incorporated herein in its entirety by reference.

BACKGROUND

1. Field of the Invention

One or more embodiments relate to a cassette for accommodating substrates.

2. Description of the Related Art

Generally, flat display devices, such as organic light-emitting display devices or liquid crystal display (LCD) devices, use large-sized mother glass for convenience in a manufacturing process.

When flat display devices are manufactured, a cassette for accommodating substrates is used to receive/transfer or store a plurality of pieces of mother glass. The cassette for accommodating substrates provides a space in which substrates, such as a plurality of pieces of mother glass, are accommodated.

In general, a clean room required to manufacture flat display devices has a facility for air cleaning. However, attachment of foreign substances that are generated by a worker or float in the clean room to an open cassette for accommodating substrates and to a surface of mother glass frequently occurs. Thus, quality of flat display devices may be lowered. Thus, the cassette for accommodating substrates needs to be sealed.

SUMMARY

One or more embodiments may provide a cassette including: a cassette main body for accommodating a plurality of substrates, the cassette main body having an open side; a door detachably coupled to the open side for optionally sealing the cassette main body; a pin unit disposed on the door and configured to be coupled to the cassette main body; and a magnetic portion on the door configured for coupling the door with the cassette main body according to movement of the pin unit.

The cassette main body may include a box-shaped framework having a plurality of frames connected to one another, and a cover plate disposed on each of the frames.

A plurality of support portions for supporting a plurality of substrates stacked in the cassette main body, the plurality of support portions extending vertically within an internal space of the cassette main body from a rear side of the cassette main body to the open side of the cassette main body and a plurality of seating portions, for supporting right and left edges of the substrates, the plurality of seating portions extending from opposing frames of the cassette main body toward the internal space of the cassette main body.

A back stopper coupled to the frame and disposed on the rear side of the cassette main body, for supporting rear edges of the substrates.

The cassette may further include a sealing member disposed along a perimeter of the door and facing an open side of the cassette main body.

The cassette may further include a sealing member disposed along a perimeter of the open side of the cassette main body.

The pin unit may include a movement portion having a movement shaft that is configured to move horizontally or vertically relative to the door; a gear portion coupled with the movement portion; a driving lever connected to the gear portion and configured to rotate the gear portion; and a pin guide portion coupled with the movement portion and including a safety pin.

A rack gear may be interlocked with the gear portion, the rack gear may be disposed on a lower portion of the movement shaft.

The driving lever may be coupled to a front side of the gear portion on the same axle as the gear portion.

The pin guide portion may include: a pin shaft having a pin guide hole; a guide pin inserted into the pin guide hole and configured to be moveable therein; and the safety pin coupled with the guide pin and configured to be moved for optionally coupling with the cassette main body.

One end of the pin shaft and one end of the movement shaft may be overlapping in a horizontal direction.

The pin guide hole may extend diagonally through the pin shaft.

The guide pin may extend through the pin guide hole and may be configured to move within the pin guide hole as the pin shaft is moved.

The safety pin may penetrate the pin shaft from an upper portion of the pin shaft and may be coupled to the guide pin.

A safety pin guide for surrounding the safety pin, the safety pin guide may be in a portion of the pin shaft in which the safety pin penetrates the pin shaft.

A slide guide for guiding movement of the safety pin may be disposed at a position corresponding to a portion of the pin shaft in which the safety pin is moved, and a slide guide hole defined in the slide guide for providing a movement path of the safety pin.

An O-ring may be disposed on inner circumferential walls of the slide guide having the slide guide hole.

A door guide block having a pin hole may be coupled with a frame of the cassette main body.

The magnetic portion may include: at least one magnet disposed on one side of the movement shaft; and a conductive plate disposed in the cassette main body at a position corresponding to the at least one magnet and configured to be optionally combined with the at least one magnet as the movement shaft is moved.

The pin unit may further include an auxiliary movement portion having an auxiliary movement shaft that is configured to move in synchrony with the movement portion.

An auxiliary rack gear may be interlocked with the gear portion may be disposed on one side of the auxiliary movement shaft.

A stopper may be disposed on an end of the movement shaft for preventing interference between the movement shaft and the auxiliary movement shaft.

At least one magnet may be disposed on one side of the auxiliary movement shaft, and a conductive plate may be disposed in a position of the cassette main body corresponding to the at least one magnet and may be optionally coupled with the at least one magnet as the auxiliary movement shaft is moved.

At least one position alignment hole may be formed in a front side of the door such that a corresponding one of the position alignment pins of an external tool for optionally opening or closing the door coupled with the cassette main body may be inserted therein into the at least one position alignment hole for aligning a position of the external tool combined with the door.

A plurality of position alignment holes may be aligned diagonally across a front side of the door.

The cassette may further include a gas filter portion disposed in the door for controlling an internal pressure of the sealed cassette.

The cassette may further include at least one slide guide for facilitating coupling of door with the cassette main body.

A portion of the slide guide may be configured tol be received in the opening of the cassette main body and may be tapered.

The cassette may further include an overhead hoist transport (OHT) grip disposed on a top end of the cassette main body for facilitating conveyance of the cassette for accommodating substrates.

BRIEF DESCRIPTION OF THE DRAWINGS

The above and other features and advantages of the embodiments will become more apparent by describing in detail exemplary embodiments thereof with reference to the attached drawings in which.

DETAILED DESCRIPTION

As the embodiments allow for various changes and numerous embodiments, particular embodiments will be illustrated in the drawings and described in detail in the written description. However, this is not intended to limit the embodiments to particular modes of practice, and it is to be appreciated that all changes, equivalents, and substitutes that do not depart from the spirit and technical scope of the embodiments are encompassed in the present invention. In the description of the embodiments, certain detailed explanations of related art are omitted when it is deemed that they may unnecessarily obscure the essence of the embodiments.

While such terms as "first," "second," etc., may be used to describe various components, such components must not be limited to the above terms. The above terms are used only to distinguish one component from another.

The terms used in the present specification are merely used to describe particular embodiments, and are not intended to limit the embodiments. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It should further be understood that the terms "combined," "coupled," and "attached," may be used interchangeably herein.

The embodiments will now be described more fully with reference to the accompanying drawings, in which exemplary embodiments are shown. Those components that are the same or are in correspondence are rendered the same reference numeral regardless of the figure number, and redundant explanations are omitted.

Figure 1:
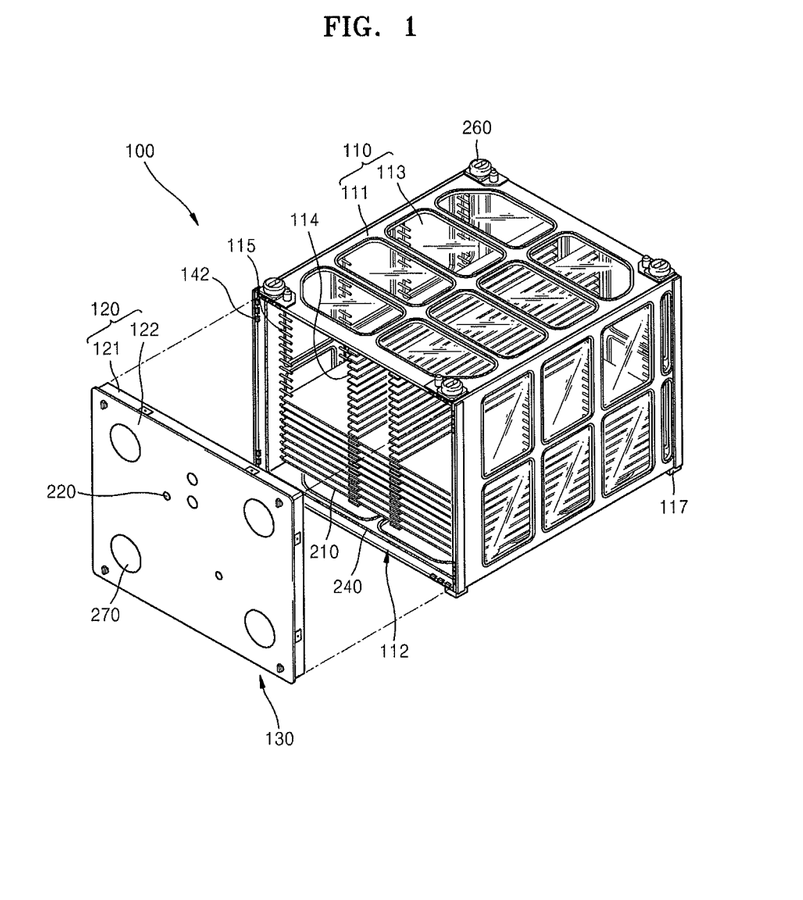
FIG. 1 illustrates an exploded perspective view of a cassette for accommodating substrates when viewed from a front direction, according to an embodiment.
Figure 2:
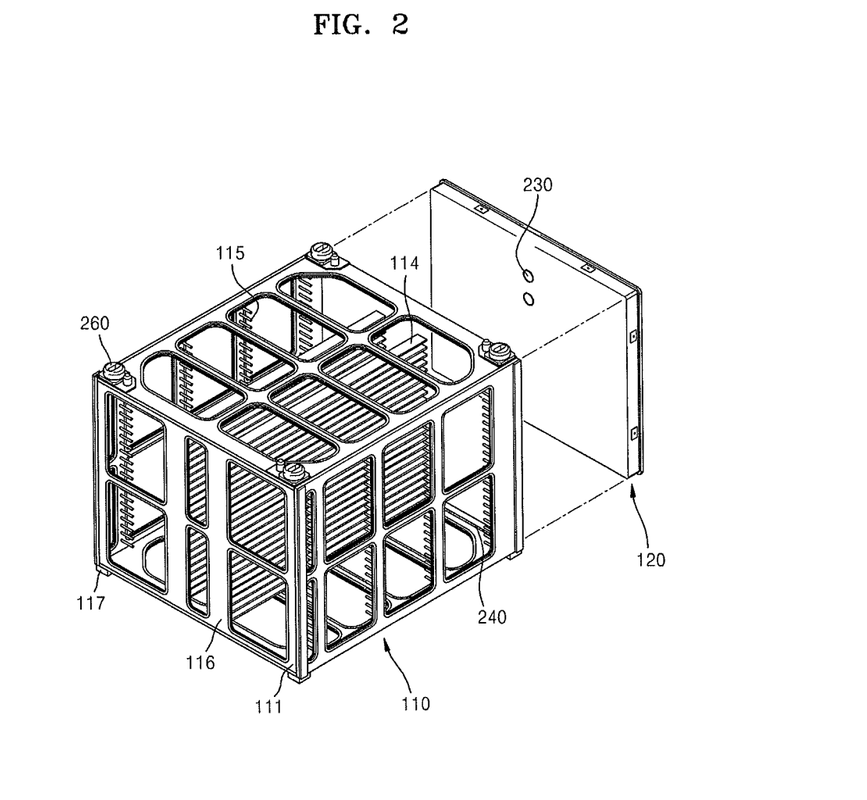
FIG. 2 illustrates an exploded perspective view of the cassette for accommodating substrates illustrated in FIG. 1, when viewed from a rear direction.
Figure 3:
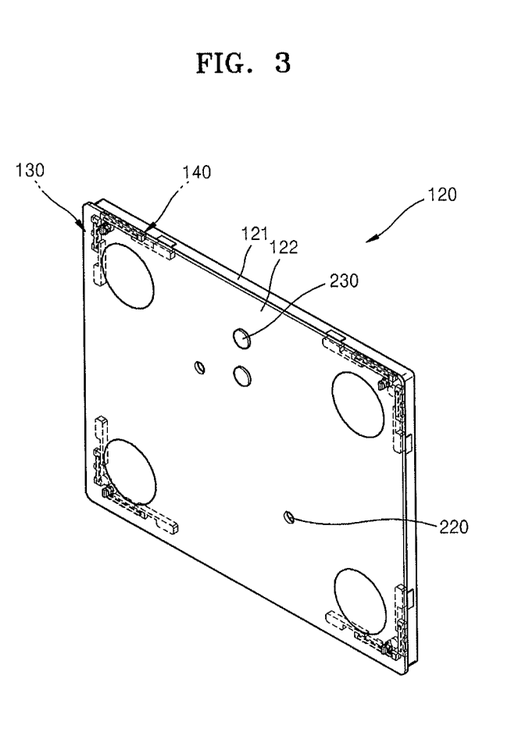
FIG. 3 illustrates a perspective view of a door of FIG. 1.

FIG. 1 illustrates an exploded perspective view of a cassette 100 for accommodating substrates when viewed from a front direction, according to an embodiment. FIG. 2 illustrates an exploded perspective view of the cassette 100 for accommodating substrates illustrated in FIG. 1, when viewed from a rear direction. FIG. 3 illustrates a perspective view of a door 120 of FIG. 1.

Referring to FIGS. 1 through 3, the cassette 100 for accommodating substrates may include a cassette main body 110, the door 120, a pin unit 130, and a magnetic portion 140.

The cassette main body 110 may have a box-shaped framework including a plurality of frames 111 that are connected to one another. For example, each of the plurality of frames 111 may define a side of the cassette main body 100. Each of the plurality of frames 111 may include one or more open regions 111a defined therethrough. An opening 112 may be formed in at least one side of the cassette main body 110 so as to provide a path to a cavity in the cassette main body in which a plurality of substrates 210, such as mother glass, may be accommodated. Each of the frames 111 may be formed of a metal having excellent strength.

A cover plate 113 may be disposed on the frames 111. One cover plate 113 may be disposed on every side of the framework, i.e., every side of the cassette main body, or a plurality of cover plates 113 may be coupled to the plurality of frames 111, to cover the open regions 111a of each of the frames 111. For example, each of the open regions 111a may be covered by a separate cover plate 113.

The method by which the cover plate 113 may be coupled to the frames 111 is not limited to any one combination or coupling method. According to some embodiments, a combination method may be used, which includes forming a groove in the frames 111 and inserting the cover plate 113 into the groove. According to some embodiments, a combination method may be used, which includes coupling the cover plate 113 to the frames 111 using screws inserted from front or rear sides of the frames 111. The cover plate 113 may cover all outer portions of the frames 111, except for the opening 112. The cover plate 113 may include a polymer resin, such as polycarbonate.

At least one support portion 114 may be disposed in the cassette main body 110 and may support each of the substrates 210 stacked in the cassette main body 110. The substrates 210 may be stacked in a vertical direction, i.e. vertically, within the cassette main body 110. The support portion 114 may prevent the substrates 210, which are relatively large, from sagging downward in the cassette main body 110.

At least one support portion 114 may be disposed horizontally across an internal space or cavity of the cassette main body 110, from a rear side of the cassette main body 110 towards the opening 112, at a front side of the cassette main body 110. The support portion 114 may be combined with the frames 111 of the cassette main body 110 by a separate support member (not shown). The support portion 114 may be a strip that supports lower sides, e.g., a bottom surface, of the substrates 210. A plurality of support portions 114 may be disposed spaced apart from one another in a vertical direction in the cassette main body 110.

A plurality of seating portions 115 may be disposed on opposite sides of the cassette main body 110. Each of the seating portions 115 may have a projecting part that protrudes from opposing right and left frames 111 within the internal space of the cassette main body 110. The opposing right and left frames 111 may face each other. The seating portions 115 may support right and left edges of the substrates 210. The seating portions 115 may be located at the same heights as the support portions 114.

Thus, when the substrates 210 are received in the cassette main body 110, the lower sides of the substrates 210 are supported by the support portions 114. In addition, both left and right edges of the substrates 210 may be supported by the seating portions 115. Accordingly, each substrate 210 may be safely located, i.e., securely disposed, in the internal space of the cassette main body 110.

A back stopper 116 may be disposed on the rear side of the cassette main body 110. The back stopper 116 may be at least one strip disposed in the vertical direction of the cassette main body 110. The back stopper 116 may be connected to a rear frame 111 of the cassette main body 110. Rear edges of the substrates 210 may be supported by the back stopper 116.

The back stopper 116 may act as a stopper that prevents the substrates 210 from escaping from the internal space of the cassette main body 110 through the rear side of the cassette main body 110.

One or more pads 117 may be disposed on a lower end of the frames 111. For example, the pads 117 may extend from a bottom surface of the cassette main body 110. The pads 117 may act as a buffer that absorbs external shock when the cassette main body 110 is moved.

The door 120 is disposed on the front side of the cassette main body 110. The door 120 may be optionally combined with, i.e., coupled to, the opening 112, which may provide a path or entrance through which the substrates 210 may be inserted into the internal space of the cassette main body 110. Thus, the cassette main body 110 may be opened or sealed via the door 120.

The door 120 may include a door frame 121, and a door plate 122 that is combined with the door frame 121. The door 120 may have a size large enough to cover the entire opening 112.

The pin unit 130 to be combined with the cassette main body 110 may be disposed on the door 120. The magnetic portion 140 may be disposed on the cassette main body 110 and the door 120 to allow the door 120 to be optionally combined with the cassette main body 110 as the pin unit 130 is moved.

The relationship between the pin unit 130 and the magnetic portion 140 will now be described in more detail.

Figure 4:
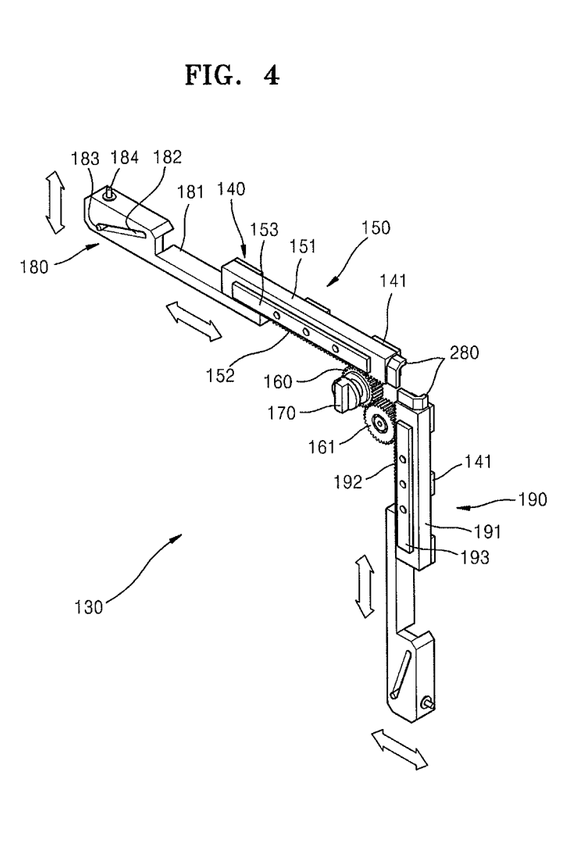
FIG. 4 illustrates a perspective view of a pin unit and a magnetic portion of FIG. 3.
Figure 5:
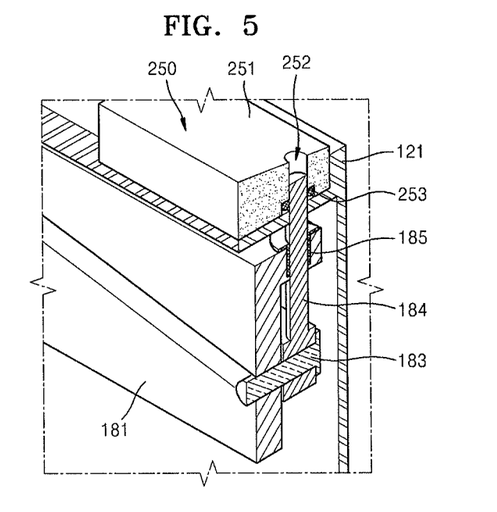
FIG. 5 illustrates a partially-cut perspective view of the pin unit of FIG. 4 before a safety pin of the pin unit has ascended.
Figure 6:
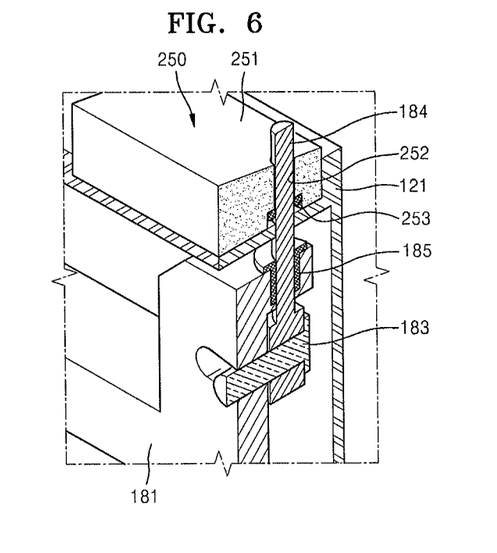
FIG. 6 is a partially-cut perspective view of the pin unit of FIG. 4 after the safety pin of has ascended.
Figure 7:
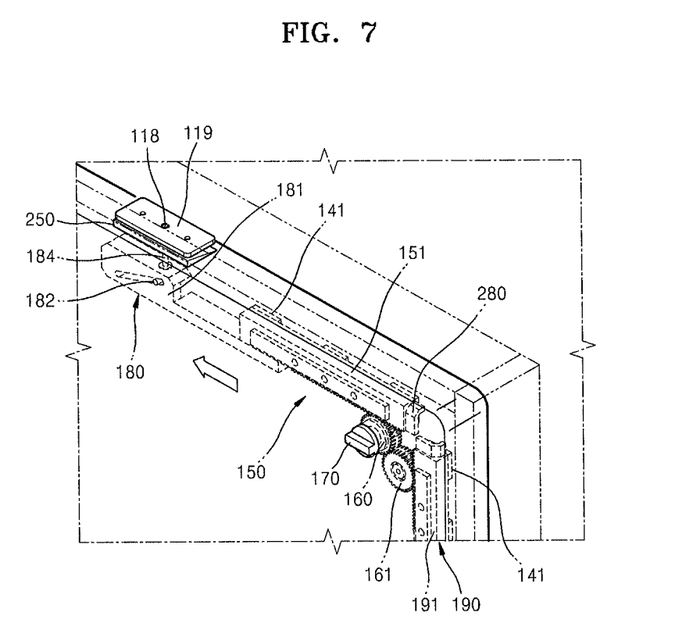
FIG. 7 illustrates a perspective view of a pin unit and a magnetic portion of FIG. 3 in operation.

FIG. 4 illustrates a perspective view of the pin unit 130 and the magnetic portion 140 of FIG. 3. FIG. 5 illustrates a partially-cut perspective view of the pin unit of FIG. 4 before a safety pin 184 has ascended. FIG. 6 illustrates a partially-cut perspective view of the pin unit 130 of FIG. 5 after the safety pin 184 has ascended. FIG. 7 illustrates a perspective view of the pin unit 130 and the magnetic portion 140 of FIG. 3 in operation.

Referring to FIGS. 4 through 7, the pin unit 130 may be disposed in or coupled to four edge regions of the door 120 of FIG. 1. The pin unit 130 may include a movement portion 150 having a movement shaft 151 that may be moved in a horizontal or vertical direction relative to the door 120, a gear portion 160 combined with the movement portion 150, a driving lever 170 that rotates the gear portion 160, and a pin guide portion 180 combined with the movement portion 150.

The movement shaft 151 may be a metal plate, e.g. a metal plate shaped as a straight line, that has a predetermined length and may be disposed in a horizontal direction relative to the door 120. A rack gear 152 may be disposed on a lower portion of the movement shaft 151 and may extend horizontally relative to the movement shaft 151. A rack gear guide 153 may be disposed on a side, e.g., front side, of the movement shaft 151.

The gear portion 160 may be disposed below the movement shaft 151. The gear portion 160 may be interlocked with the rack gear 152. The driving lever 170 may be combined with a side, e.g., front side, of the gear portion 160, on the same axle as the gear portion 160. When the driving lever 170 is rotated in one direction, the gear portion 160 may be rotated. Thus, the movement shaft 151 having the rack gear 152 may move in a rectilinear fashion.

The pin guide portion 180 may be combined with the movement portion 150. The pin guide portion 180 may include a pin shaft 181 having a pin guide hole 182 formed therein. A guide pin 183 may be inserted into the pin guide hole 182 and may be moveable therein. A safety pin 184 may be combined with the guide pin 183 and may ascend and descend to be optionally combined with the cassette main body 110.

The pin shaft 181 may be a metal plate that extends in a direction parallel to the movement shaft 151. The pin shaft 181 may be disposed a predetermined distance below the movement shaft 151. One end of the pin shaft 181 may overlap with one end of the movement shaft 151, and extend horizontally from the movement shaft 151. The one end of the pin shaft 181 and the one end of the movement shaft 151 may be fixed or secured together by bolt coupling. Thus, when the movement shaft 151 moves in a rectilinear and reciprocating fashion, the pin shaft 181 may also move in a rectilinear and reciprocating fashion at the same time.

The pin guide hole 182 may be formed in a lengthwise direction of the pin shaft 181. For example, the pin guide hole 182 may extend substantially along the length of the pin shaft 181. The pin guide hole 182 may be a rectangular groove that extends through a thickness of the pin shaft 181. The pin guide hole 182 is formed to be inclined in a horizontal direction of the pin shaft 181 by a predetermined angle. For example, the pin guide hole 182 may extend diagonally across the pin shaft 181. In an implementation, one end of the pin guide hole 182 may be located at a higher position in the horizontal direction of the pin shaft 181, and another side of the pin guide hole 182 may be located at a lower position in the horizontal direction of the pin shaft 181. For example, one end of the pin guide hole 182 may closer to a top surface of the pin shaft 181 than an opposing end of the pin guide hole 182.

The guide pin 183 may be combined with the pin guide hole 182. The guide pin 183 may be arranged in the thickness direction of the pin shaft 181, e.g., the guide pin 183 may extend through the pin shaft. The guide pin 183 may be inserted into the pin guide hole 182. The guide pin 183 may extend from one side of the pin shaft 181 to another side of the pin shaft 181. A position of the guide pin 183 may be changed along the incline of the pin guide hole 182 as the pin shaft 181 is moved.

The safety pin 184 may penetrate the pin shaft 181 from an upper portion or surface of the pin shaft 181 in a vertical direction relative to the pin shaft 181 and may be inserted into the pin shaft 181. One end of the safety pin 184 that penetrates the pin shaft 181 may be combined with the guide pin 183. A safety pin guide 185 may surround the safety pin 184 and may be disposed in a portion of the pin shaft 181 in which the safety pin 184 penetrates the pin shaft 181.

A pin hole 118 (FIG. 7) to which the safety pin 184 may optionally be combined when the safety pin 184 ascends, may be formed in a position corresponding to the position of the safety pin 184 in the cassette main body 110. The pin hole 118 may be formed in a door guide block 119, and the door guide block 119 may be combined with the frames 111 of the cassette main body 110.

A slide guide 250 may be disposed on the upper portion of the pin shaft 181. A plurality of slide guides 250 may be spaced apart from one another by a predetermined distance along an outer perimeter of the door frame 121 that faces the opening 112 of the cassette main body 110. In the current embodiment, the slide guide 250 may be disposed at a position corresponding to a position of the portion of the pin shaft 181 in which the safety pin 184 of the pin unit 130 ascends and descends.

A portion 251 (FIGS. 5 and 6) of the slide guide 250 that will be received in the opening 112 of the cassette main body 110 may be tapered so that the door 120 may be smoothly combined with the cassette main body 110. The slide guide 250 may include a polymer resin.

In addition, the slide guide 250 may guide the ascending and descending motion of the safety pin 184. To this end, the slide guide 250 may include a slide guide hole 252 formed in a vertical direction of the slide guide 250, e.g., extending vertically within the slide guide 250. The safety pin 184 may move in an ascending and descending fashion along the slide guide hole 252. An O-ring 253 may be disposed within an inner circumferential wall of the slide guide 250 having the slide guide hole 252 formed therein, to facilitate maintaining an airtight state.

In this regard, the magnetic portion 140 (FIG. 4) may be disposed on the cassette main body 110 and the door 120. The magnetic portion 140 may include at least one magnet 141 disposed on either the door 120 or the cassette main body 110, and a conductive plate 142 (FIG. 1) disposed on the door 120 (if the magnet 141 is on the cassette main body 110) or the cassette main body 110 (if the magnet 141 is on the door 120) at a position corresponding to the magnet 141.

A plurality of magnets 141 may be spaced apart from one another by a predetermined distance, and may extend horizontally along a side, e.g., rear side, of the movement shaft 151. The magnets 141 may include a highly magnetic material, such as neodymium.

The conductive plate 142 may be disposed along the opening 112 of the cassette main body 110 to face the magnet 141, and may be combined with the magnets 141 due to a magnetic force therebetween when the door 120 is coupled to the cassette main body 110. The conductive plate 142 may be coupled to the cassette main body 110 by, for example, inserting the conductive plate 142 in a groove formed in the frames 111 of the cassette main body 110. The conductive plate 142 may be coupled to the cassette main body 110 in any suitable manner, as long as the conductive plate 142 is disposed on the cassette main body 110.

An auxiliary movement portion 190 (FIG. 4) may be further included in the pin unit 130. The auxiliary movement portion 190 may include an auxiliary movement shaft 191 that may be configured to move in synchrony, i.e., at the same time as, the movement portion 150. For example, when the movement portion is moved in the horizontal direction relative to the door 120, the auxiliary movement portion 190 may moved in the vertical direction relative to the door 120.

In the current embodiment, the movement portion 150 may be moved horizontally with respect to the door 120, and the auxiliary movement portion 190 may be moved vertically with respect to the door 120. However, embodiments are not limited thereto, and the movement portion 150 may be moved vertically with respect to the door 120, and the auxiliary movement portion 190 may be moved horizontally with respect to the door 120.

The auxiliary movement shaft 191 may be a metal plate, e.g., a straight, line-shaped metal plate, which has a predetermined length, and may be disposed in the vertical direction of the door 120. An auxiliary rack gear 192 may be disposed on a side, e.g., front side, of the auxiliary movement shaft 191, and extend along a length of the auxiliary movement shaft 191. An auxiliary rack gear guide 193 may be disposed on a side, e.g., lateral side, of the auxiliary movement shaft 191.

The auxiliary rack gear 192 may be interlocked with the gear portion 160. At least one idle gear 161 may be disposed between the gear portion 160 and the auxiliary rack gear 192.

When the driving lever 170 is rotated in one direction, the movement shaft 151 may move in a rectilinear and reciprocating fashion in the horizontal direction relative to the door 120. The gear portion 160 and the idle gear 161 may be rotated. As such, the auxiliary movement shaft 191 may move in a rectilinear and reciprocating fashion, in the vertical direction relative to the door 120. In this way, the auxiliary movement shaft 191 may be moved in synchronization with the movement of the movement shaft 151.

A plurality of magnets 141 may be spaced apart from one another by a predetermined distance along the length of the auxiliary movement shaft 191. A conductive plate 142 may be disposed on the cassette main body 110 in a position corresponding to the position of the magnets 141 along the opening 112 of the cassette main body 110.

The movement shaft 151, which may be moved in the horizontal direction relative to the door 120, and the auxiliary movement shaft 191, which may be moved in the vertical direction relative to the door 120, may interfere with each other when moved in a rectilinear and reciprocating fashion. Thus, a stopper 280 for preventing interference between the movement shaft 151 and the auxiliary movement shaft 191 may be disposed on an end of the movement shaft 151 or an end of the auxiliary movement shaft 191.

Referring back to FIGS. 1 through 3, at least one position alignment hole 220 may be formed in the front side of the door 120. The at least one position alignment hole 220 may be formed in the door 120 such that, when the door 120 is combined with the cassette main body 110, in order to determine whether an external tool for vacuum suction of the door 120, such as a robot tool, is aligned in a right position, position alignment pins of the robot tool may be inserted into the at least one position alignment hole 220 of the door 120.

The at least one position alignment hole 220 may have a size which allows the position alignment pins of the robot tool to be inserted into the at least one position alignment hole 220 in a thickness direction of the door plate 122, e.g., inserted within the door plate 122, from the front side of the door 120. The position alignment hole 220 may not penetrate, e.g., extend through, the door plate 122. A plurality of position alignment holes 220 may be aligned diagonally across the front side of the door 120.

An additional device for controlling a pressure-resistant property, improving a sealing property, or vacuum suctioning may be installed at the door 120.

A plurality of gas filter portions 230 may be disposed in the door 120. When an internal pressure of the cassette 100 for accommodating substrates increases, the gas filter portions 230 discharge air in the cassette 100 for accommodating substrates or filters out foreign substances attached to the cassette 100 for accommodating substrates.

In addition, a sealing member 240 may be formed inside the frames 111 along a perimeter of the opening 112 of the cassette main body 110. Alternatively, the sealing member 240 may be formed along the perimeter of the door 120 that faces the opening 112 of the cassette main body 110.

Furthermore, an overhead hoist transport (OHT) grip 260 may be disposed on a top end of the cassette main body 110 to facilitate conveyance of the cassette 110 for accommodating substrates.

A vacuum suction region 270 in which a vacuum suction portion of the robot tool performs vacuum suction may be formed on the front side of the door 120, which is opposite to the opening 112 of the cassette main body 110. The vacuum suction region 270 may be formed at an edge of the door 120. The vacuum suction portion of the robot tool may perform vacuum suction over the entire vacuum suction region 270 so that the door 120 may be optionally detached from the cassette main body 110.

An operation of the cassette 100 for accommodating substrates having the above structure will now be described with reference to FIGS. 1 through 7.

In the cassette 100 for accommodating substrates, the plurality of substrates 210 may be stacked in the cassette main body 110, and the door 120 may be combined with the cassette main body 110.

First, the robot tool may be closely adhered to the door 120. Then, the plurality of position alignment pins of the robot tool may be inserted into the position alignment holes 220, which may be aligned diagonally across the front side of the door 120. The plurality of position alignment pins of the robot tool may be inserted into the position alignment holes 220 so that a determination may be made as to whether the robot tool is aligned in a right position with respect to the door 120.

Next, a plurality of vacuum absorption portions of the robot tool may perform vacuum suction over the vacuum suction region 270 formed in four edge regions of the front side of the door 120. The door 120 may be attached to the plurality of vacuum suction portions of the robot tool until one cycle of processes is completed, to reduce the number of processes.

Subsequently, the pin unit 130 may be installed as a safety device so as to reinforce a combination force, e.g., attachment, between the door 120 and the cassette main body 110 and to facilitate joining the door 120 to the cassette main body or releasing the door 120 from the cassette main body 110.

In an implementation, the safety pin 184 may be combined with the pin hole 118 formed in the door guide block 119 of the cassette main body 110. In order to release the combination state of the safety pin 184 and the pin hole 118, the driving lever 170 may be rotated in a clockwise direction (FIG. 7), which also rotates the gear portion 160 combined with the driving lever 170 in a clockwise direction.

When the gear portion 160 is rotated clockwise, the movement shaft 151 having the rack gear 152 interlocked with the gear portion 160 may be moved to the right, as illustrated in FIG. 7.

When the movement shaft 151 is moved, the pin shaft 181, which is bolt-coupled to the movement shaft 151, may move to the right. When the pin shaft 181 is moved, the guide pin 183 inserted into the pin guide hole 182 and inclined in the horizontal direction, e.g., extending diagonally across the pin shaft 181, may be moved to a lower position from a higher position.

When the guide pin 183 is moved to the lower position in the pin guide hole 182, the safety pin 184, which is combined with the guide pin 183, may descend vertically along the safety pin guide 185, formed in the pin shaft 181, and the slide guide hole 252, formed in the slide guide 250. Thus, the safety pin 184 may be detached from the pin hole 118 formed in the door guide block 119 of the cassette main body 110.

In addition, when the movement shaft 151 is moved to the right, the magnets 141, disposed spaced apart from one another along the rear side of the movement shaft 151, may also move to the right. Thus, the magnets 141 may be detached from the conductive plate 142 installed at the opening 112 of the cassette main body 110.

As described above, as the gear portion 160 combined with the auxiliary rack gear 192 is rotated, the magnets 141 combined with the conductive plate 142 via magnetism may be released, and simultaneously, the combination state of the safety pin 184 inserted into the pin hole 118 may be released.

When the movement shaft 151 is moved to the right, the auxiliary movement shaft 191, extending vertically in the door 120, may be synchronized with the movement shaft 151 and may ascend or move to an elevated position.

In an implementation, when the driving lever 170 and the gear portion 160 are rotated clockwise, the idle gear 161, interlocked with the gear portion 160, may be rotated counterclockwise. When the idle gear 161 is rotated, the auxiliary movement shaft 191, having the auxiliary rack gear 192 combined with the gear portion 160 via the idle gear 161 may ascend, as illustrated in FIG. 7. Thus, the magnets 141 disposed spaced apart from one another along the rear side of the auxiliary movement shaft 191 may be moved upwards and may be detached from the conductive plate 142 disposed in a position corresponding to the magnets 141.

Subsequently, the door 120, attached to the cassette main body 110 by the vacuum suction portions of the robot tool, may be detached from the cassette main body 110.

Next, the plurality of substrates 210 stacked in the cassette main body 110 in the vertical direction of the cassette main body 110 may be ejected by an ejecting tool and then transferred according to a desired process.

After the ejection of the substrate 210 stacked in the cassette main body 110 is completed, a plurality of substrates 210 may be received in the cassette main body 110.

In this regard, since each of the substrates 210 has a large size, a middle portion thereof may sag downwards. To prevent this problem, the substrates 210 may be supported by the at least one support portion 114 disposed across the internal space of the cassette main body 110 and extending from the rear side of the cassette main body 110 towards the opening 112. Simultaneously, the right and left edges of the substrates 210 may be seated on the seating portions 115, which protrude from the left and right frames 111 facing one another.

In addition, the substrates 210 may be supported by the back stopper 116 disposed on the rear side of the cassette main body 110. The back stopper 116 may prevent the substrates 210 from escaping through the rear side of the cassette main body 110. Thus, each substrate 210 may be safely accommodated in the cassette main body 110.

As described above, when the plurality of substrates 210 have been received again in the cassette main body 110, the door 120 may be combined with the cassette main body 110. The door 120 may be attached to the cassette main body 110 by vacuum suction performed by the vacuum suction portions of the robot tool described previously.

The pin unit 130 may operate to allow the door 120 to be combined with the cassette main body 110.

The driving lever 170 may be rotated counterclockwise, and thus the gear portion 160 combined with the driving lever 170 may be rotated counterclockwise. When the gear portion 160 is rotated counterclockwise, the movement shaft 151 having the rack gear 152 interlocked with the gear portion 160 may be moved to the left. When the movement shaft 151 is moved to the left, the pin shaft 181, which is bolt-coupled to the movement shaft 151, may be moved to the left.

When the pin shaft 181 is moved to the left, the guide pin 183 may be moved to a higher position from a lower position in the pin shaft 181.

When the guide pin 183 is moved to the higher position in the pin guide hole 182, the safety pin 184 combined with the guide pin 183, may ascend in the vertical direction of the pin shaft 181 along the safety pin guide 185 formed on the pin shaft 181 and the slide guide hole 252 formed in the slide guide 250. Thus, the safety pin 184 is inserted into the pin hole 118 formed in the door guide block 119 of the cassette main body 100.

In addition, when the movement shaft 151 is moved to the left, the magnets 141, spaced apart from one another along the rear side of the movement shaft 151, may also move left, and thus, may be combined with the conductive plate 142 installed in a position corresponding to the magnets 141 at the opening 112 of the cassette main body 110.

As described above, as the gear portion 160 combined with the driving lever 170 is rotated, the magnets 141 may be combined with the conductive plates 142 due to a magnetic force, and simultaneously, the safety pin 184 may be combined with the pin hole 118.

When the movement shaft 151 is moved to the left, the auxiliary movement shaft 191 disposed in the vertical direction of the door 120, and also synchronized with the movement shaft 151, may descend.

In an implementation, when the driving lever 170 and the gear portion 160 are rotated counterclockwise, the idle gear 161 interlocked with the gear portion 160 may be rotated clockwise. When the idle gear 161 is rotated clockwise, the auxiliary movement shaft 191 having the rack gear 192 combined with the gear portion 160 via the idle gear 161 may descend. Thus, the magnets 141, spaced apart from one another along the rear side of the auxiliary movement shaft 191, may also move downwards and, thus, may be combined with the conductive plate 142 corresponding to the magnets 141.

In this regard, the slide guide 250 may be disposed above the pin shaft 181. A portion of the slide guide 250 that will be received in the opening 112 of the cassette main body 110 may be tapered. As such, the door 120 may be smoothly combined with the cassette main body 110.

Furthermore, the sealing member 140 may be disposed on the rear side of the door 120, facing the opening 112 of the cassette main body 110, along the perimeter of the door 120. Thus, a sealing property may be improved.

Next, the vacuum suction portions of the robot tool may be detached from the vacuum absorption region 270 of the door 120.

Subsequently, the position alignment pins of the robot tool may be detached from the position alignment holes 220 extending diagonally along the front side of the door 120.

Thus, the position alignment pins of the robot tool may be detached from the door 120.

As described above, in the cassette 110 for accommodating substrates, the safety pin 184 may be combined with or released from the pin hole 118 by operating the pin unit 130, and simultaneously, the magnets 141 may be combined with or released from the conductive plates 142.

As described above, in a cassette for accommodating substrates according to the embodiments, a door may be fully adhered to a cassette main body so that an external source of substrate contamination may be removed. In addition, the door may be combined with the cassette main body by a combination of a pin unit and a magnetic portion. Thus, the cassette for accommodating substrates may be solidly fixed.

One or more embodiments provide a cassette for accommodating substrates that removes a source of substrate contamination by optionally fully sealing an internal space of the cassette in which the plurality of substrates are accommodated.

While the embodiments have been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A cassette for accommodating substrates, the cassette comprising;
    a cassette main body for accommodating a plurality of substrates, the cassette main body having an open side;
    a door detachably coupled to the open side for optionally sealing the cassette main body;
    a pin unit disposed on the door and configured to be coupled to the cassette main body, the pin unit including:
        a movement portion having a movement shaft, the movement shaft being configured to move horizontally or vertically relative to the door;
        a gear portion coupled with the movement portion;
        a driving lever connected to the gear portion and configured to rotate the gear portion; and
        a pin guide portion coupled with the movement portion and including a safety pin; and
    a magnetic portion on the door configured for coupling the door with the cassette main body according to movement of the pin unit.

2. The cassette of claim 1, wherein the cassette main body includes a box-shaped framework having a plurality of frames connected to one another, and a cover plate disposed on each of the frames.

3. The cassette of claim 2, further comprising:
    a plurality of support portions for supporting a plurality of substrates stacked in the cassette main body, the plurality of support portions extending vertically within an internal space of the cassette main body from a rear side of the cassette main body to the open side of the cassette main body; and
    a plurality of seating portions, for supporting right and left edges of the substrates, the plurality of seating portions extending from opposing frames of the cassette main body toward the internal space of the cassette main body.

4. The cassette of claim 3, further comprising
    a back stopper coupled to the frame and disposed on the rear side of the cassette main body, for supporting rear edges of the substrates.

5. The cassette of claim 1, further comprising a sealing member disposed along a perimeter of the door and facing the open side of the cassette main body.

6. The cassette of claim 1, further comprising a sealing member disposed along a perimeter of the open side of the cassette main body.

7. The cassette of claim 1, including:
    a rack gear interlocked with the gear portion, the rack gear being disposed on a lower portion of the movement shaft.

8. The cassette of claim 1, wherein the driving lever is coupled to a front side of the gear portion on the same axle as the gear portion.

9. The cassette of claim 1, wherein the pin guide portion includes:

a pin shaft having a pin guide hole;
a guide pin inserted into the pin guide hole and configured to be moveable therein; and
the safety pin coupled with the guide pin and configured to be moved for optionally coupling with the cassette main body.

10. The cassette of claim 9, wherein one end of the pin shaft and one end of the movement shaft are overlapping in a horizontal direction.

11. The cassette of claim 9, wherein the pin guide hole extends diagonally through the pin shaft.

12. The cassette of claim 11, wherein the guide pin extends through the pin guide hole and is configured to move within the pin guide hole as the pin shaft is moved.

13. The cassette of claim 12, wherein the safety pin penetrates the pin shaft from an upper portion of the pin shaft and is coupled to the guide pin.

14. The cassette of claim 13, including:
a safety pin guide for surrounding the safety pin, the safety pin guide being in a portion of the pin shaft corresponding to a position in which the safety pin penetrates the pin shaft.

15. The cassette of claim 9, including:
a slide guide for guiding movement of the safety pin, the slide guide being disposed at a position corresponding to a portion of the pin shaft in which the safety pin is moved,
and a slide guide hole defined in the slide guide for providing a movement path of the safety pin.

16. The cassette of claim 15, wherein an O-ring is disposed on inner circumferential walls of the slide guide having the slide guide hole.

17. The cassette of claim 9, further comprising:
a door guide block having a pin hole, the door guide block being coupled with a frame of the cassette main body.

18. The cassette of claim 1, wherein the magnetic portion includes:
at least one magnet disposed on one side of the movement shaft; and
a conductive plate disposed in the cassette main body at a position corresponding to the at least one magnet and configured to be optionally coupled with the at least one magnet as the movement shaft is moved.

19. The cassette of claim 1, wherein the pin unit further includes an auxiliary movement portion having an auxiliary movement shaft configured to move in synchrony with the movement portion.

20. The cassette of claim 19, further including an auxiliary rack gear interlocked with the gear portion and disposed on one side of the auxiliary movement shaft.

21. The cassette of claim 20, further including a stopper disposed on an end of the movement shaft for preventing interference between the movement shaft and the auxiliary movement shaft.

22. The cassette of claim 19, wherein at least one magnet is disposed on one side of the auxiliary movement shaft, and a conductive plate is disposed in the cassette main body at a position corresponding to the at least one magnet, the conductive plate being configured to be optionally coupled with the at least one magnet as the auxiliary movement shaft is moved.

23. The cassette of claim 1, further including a gas filter portion in the door for controlling an internal pressure of the sealed cassette.

24. The cassette of claim 1, further including at least one slide guide for facilitating coupling of the door with the cassette main body.

25. The cassette of claim 1, wherein a portion of the slide guide is configured to be received in the opening of the cassette main body, the portion of the slide guide being tapered.

26. The cassette of claim 1, further comprising an overhead hoist transport (OHT) grip disposed on a top end of the cassette main body for facilitating conveyance of the cassette for accommodating substrates.

* * * * *